United States Patent [19]
Danilychev

[11] Patent Number: 6,104,297
[45] Date of Patent: Aug. 15, 2000

[54] CORONA DISCHARGE DETECTION SYSTEM

[76] Inventor: Vladimir A. Danilychev, 4501 Pinyon Tree La., Irvine, Calif. 92612

[21] Appl. No.: 09/234,428

[22] Filed: Jan. 20, 1999

[51] Int. Cl.[7] .................................................. G08B 17/12
[52] U.S. Cl. ........................ 340/600; 250/372; 324/536; 340/539; 340/635
[58] Field of Search .................... 340/600, 635, 340/646, 539, 693.5; 324/536; 250/372

[56] References Cited

U.S. PATENT DOCUMENTS

| | | | |
|---|---|---|---|
| 3,622,872 | 11/1971 | Boaz | 324/536 |
| 3,728,619 | 4/1973 | Harrold et al. | 324/536 |
| 3,787,707 | 1/1974 | Gregg | 361/113 |
| 3,869,665 | 3/1975 | Kenmochi et al. | 324/72 |
| 4,006,410 | 2/1977 | Roberts | 324/520 |
| 4,063,168 | 12/1977 | Franke | 324/72 |
| 4,095,173 | 6/1978 | Darrel | 324/535 |
| 4,387,336 | 6/1983 | Joy et al. | 324/536 X |
| 4,831,332 | 5/1989 | Rudisill et al. | 324/455 |
| 4,851,686 | 7/1989 | Pearson | 340/600 X |
| 5,008,548 | 4/1991 | Gat | 250/372 |
| 5,381,098 | 1/1995 | Loftness | 324/536 |
| 5,513,002 | 4/1996 | Shapanus et al. | 356/313 |
| 5,598,099 | 1/1997 | Castleman et al. | 340/522 X |
| 5,949,235 | 9/1999 | Castleman et al. | 324/456 X |

*Primary Examiner*—Thomas Mullen
*Attorney, Agent, or Firm*—Stetina Brunda Garred & Brucker

[57] ABSTRACT

A corona discharge detection device comprising an optical sensor for generating an electrical signal in response to the detection of ultraviolet radiation in a prescribed range. The detection device further comprises an alarm unit which is electrically connected to the optical sensor for generating an alarm signal in response to the electrical signal generated by the optical sensor. The detection device may further comprise a directional unit for determining the location of origin of the ultraviolet radiation. The optical sensor is configured to sense ultraviolet radiation in a spectral range of from about 185 nanometers to about 260 nanometers, and of an intensity in the range of about 1 picowatt per square centimeter to about 1 nanowatt per square centimeter.

22 Claims, 2 Drawing Sheets

CORONA DISCHARGE DETECTION SYSTEM

FIELD OF THE INVENTION

The present invention relates generally to detection equipment, and more particularly to a device for detecting with precision the location or point of origin of a corona discharge or arc in a defective high voltage cable, transformer, or equipment.

BACKGROUND OF THE INVENTION

As is well known in the electric utilities industry, defects in high voltage lines or cables or transformers which may result in localized power outages are relatively common occurrences. When such a defect manifests itself, monitoring equipment at the local electric utility company is usually operable to provide the general location of the defect. However, it then typically becomes necessary for electric company personnel to pinpoint the precise location of the defect. Even in those instances where the defect does not manifest itself as a power outage, there is still a resultant degradation in the transmission efficiency of the cable, or efficiency of the high voltage equipment. Indeed, it is known in the electric utilities industry for high voltage equipment and transmission lines to be routinely inspected for defects by electric utility company personnel.

A common trait of defective high voltage cables, transformers or equipment is that they give off an arc or corona discharge. Though this corona discharge generates ultraviolet radiation in a prescribed spectral region, the same is typically not visually observable, thus necessitating that other measures be employed to pinpoint the precise location of the defect within the high voltage cable, transformer or equipment. The present invention provides a corona discharge detection device which is operable to sense or detect a corona discharge at substantial distances, and is further specifically configured to ignore the effects of background optical radiation, and thus not generate false alarms as a result thereof. More particularly, though being operable to detect the corona discharge or arc of a defective high voltage cable, transformer or equipment at distances of up to about 300 feet, the present detection device is not triggered as a result of sunlight, objects heated to high temperatures from sunlight, heated car engines, building heaters, or incandescent or fluorescent lamps. The present detection device may also be configured to determine with accuracy the point of origin of the corona discharge, thus allowing for the expedited repair of the high voltage cable, transformer or equipment. These, and other advantages associated with the present detection device, will be discussed in more detail below.

SUMMARY OF THE INVENTION

In accordance with the present invention, there is provided a corona discharge detection device comprising an optical sensor or detector for generating an electrical signal in response to the detection of ultraviolet radiation in a prescribed range. Typically, such ultraviolet radiation is produced by the corona discharge or arc of a defective high voltage cable or transformer, or other piece of defective high voltage equipment. The present detection device further comprises an alarm unit which is electrically connected to the optical sensor for generating an alarm signal in response to the electrical signal generated by the optical sensor. The alarm unit may comprise a buzzer for purposes of generating an audible alarm, and/or an LED or other signaling device for generating a visible alarm. The alarm unit may also comprise an electronic unit which provides an audio voice warning signal to the user of the detection device.

The detection device constructed in accordance with the present invention may further comprise a directional unit for determining the location or point of origin of the ultraviolet radiation. The detection device preferably comprises a laser device which is configured to transmit a laser beam along or in generally parallel relation to an optical axis defined by the optical sensor, and more particularly an optical concentrator thereof. The present detection device may also further comprise a power supply (e.g., a battery) which is electrically connected to the optical sensor and to the alarm and directional units. Additionally, it is contemplated that the present detection device may include, as an alternative to the alarm unit, a transmission unit for transmitting the electrical signal generated by the optical sensor to a remote receiver unit which itself may generate an audible and/or visible alarm. The transmission unit may be provided in a detection device with or without the directional unit, and may be used to establish either radio or infrared frequency communication with the remote receiver unit. Additionally, it is contemplated that the electrical communication between the detection device and the remote receiver unit can be achieved without the inclusion of the transmission unit by hard wiring the optical sensor directly to the receiver unit. The optical sensor and the alarm and directional units may be contained within a hand-held housing which allows the detection device to be selectively pointed in a desired direction, and may include a video recording camera for documenting a defective point of the high voltage equipment.

The optical sensor of the present detection device is preferably configured to sense ultraviolet radiation in a spectral range or region (i.e., an optical band) of from about 185 nanometers to about 260 nanometers. Advantageously, since sun radiation in this particular optical domain is trapped by the atmospheric ozone layer, the noise level of false signals from sunlight is extremely low. Indeed, direct sunlight or sun radiation has no influence on the operation of the present detection device to altitudes of up to about 10,000 feet. Additionally, the sensing of ultraviolet radiation in this particular range substantially reduces the susceptibility of the optical sensor to false signals from low thermal background optical radiation generated by, for example, objects heated to high temperatures from sunlight, heated car engines, building heaters, and incandescent or fluorescent lamps. Additionally, the optical sensor is configured so as to allow the gain and sensitivity thereof to be raised to a level to reliably sense very weak optical signals, i.e., incident ultraviolet radiation of an intensity in a range of from about 1 picowatt per square centimeter to about 1 nanowatt per square centimeter.

The optical sensor is also preferably configured to sense ultraviolet radiation at a wide spacial detection angle of up to about 360 degrees. However, the optical sensor may be provided with the aforementioned optical concentrator for narrowing the spacial detection angle to a range of from about 0.001 radians to about 1.0 radians. The optical concentrator may comprise either a parabolic reflective light concentrator or a refractive ultraviolet transparent lens or lenses.

In those embodiments of the present invention which include a parabolic reflective light optical concentrator and the directional unit, the laser device is preferably positioned in front of or in close proximity to the optical sensor along the optical axis defined by the optical concentrator thereof, thus resulting in the laser beam being transmitted directly along the optical axis of the optical concentrator. Though the laser device casts a small shadow upon the optical sensor, such shadow does not significantly detract from or degrade the performance of the detection device. In those embodiments of the present invention which include a refractive ultraviolet transparent lens(es) optical concentrator in the directional unit, the laser device is preferably disposed in side-by-side relation to the lens assembly of the optical sensor, thus resulting in the laser beam being transmitted along an axis which is generally parallel to, but extends gradually toward, the optical axis defined by the lens assembly. Since the detection signal generated by the detection device will be the strongest when the optical axis of the optical sensor is aligned with the location or point of origin of the ultraviolet radiation (i.e., the corona discharge or arc), the transmission of the laser beam along or in generally parallel to the optical axis provides a visual indication (i.e., an illuminated laser beam spot) of such point of origin.

In those embodiments of the present detection device wherein the optical sensor is not provided with an optical concentrator, it possesses the capability to detect the corona discharge or arc produced by a defective high voltage cable or other piece of high voltage equipment at a distance of up to about 60 feet. This distance may be increased to up to about 300 feet or more by providing the optical sensor with a suitable optical concentrator. The optical sensor is preferably selected from the group consisting of vacuum solar blind photomultiplier tubes, semiconductor sensors with ultraviolet filters, solar blind avalanche vacuum photodiodes, gas-filled photodiodes, and semiconductor photodiodes.

Further in accordance with the present invention, there is provided a method of detecting a corona discharge in a defined area. The method includes the step of positioning the detection device such that the optical sensor thereof is capable of sensing the prescribed range of ultraviolet radiation within the defined area. Thereafter, an alarm signal is generated in response to the electrical signal generated by the optical sensor. The electrical signal may be transmitted to a local alarm unit or a remote receiver unit, with an audible and/or visible alarm being generated by the receiver unit itself. The method further comprises the step of determining the location of origin of the ultraviolet radiation by transmitting a laser beam along an optical axis of the optical sensor. The optical sensor of the detection device may be configured to sense the prescribed range of ultraviolet radiation at a spacial detection angle in a range of from about 0.001 radians to about 1.0 radians, with the detection device being positioned such that such spacial detection angle encompasses the defined area.

BRIEF DESCRIPTION OF THE DRAWINGS

These, as well as other features of the present invention, will become more apparent upon reference to the drawings wherein.

DETAILED DESCRIPTION OF THE PREFERRED EMBODIMENTS

Figure 1:
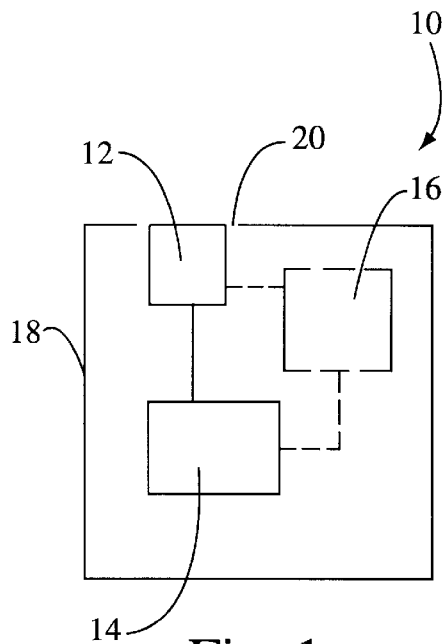
FIG. 1 is a block diagram of a corona discharge detection device constructed in accordance with a first embodiment of the present invention.

Referring now to the drawings wherein the showings are for purposes of illustrating preferred embodiments of the present invention only, and not for purposes of limiting the same, FIG. 1 depicts a corona discharge detection device 10 constructed in accordance with a first embodiment of the present invention. The detection device 10 comprises an optical sensor 12 for generating an electrical signal in response to the detection of ultraviolet radiation in a prescribed range. As previously indicated, such ultraviolet radiation is produced by the corona discharge or arc of a defective high voltage cable, transformer or other piece of high voltage equipment. The optical sensor 12 is preferably selected from the group consisting of vacuum solar blind photomultiplier tubes, semiconductor sensors with ultraviolet filters, solar blind avalanche vacuum photodiodes, gas-filled photodiodes, and semiconductor photodiodes.

The optical sensor 12 is preferably configured to sense ultraviolet radiation in a spectral range or region (i.e., an optical band) of from about 185 nanometers to about 260 nanometers. As also indicated above, since sun radiation in this particular optical domain is trapped by the atmospheric ozone layer, the noise level of false signals from sunlight is extremely low when using the detection device 10. Indeed, direct sunlight or sun radiation has no influence on the operation of the detection device 10 to altitudes of up to about 10,000 feet. Additionally, the sensing of ultraviolet radiation in this prescribed range substantially reduces the susceptibility of the optical sensor 12 to false signals from low thermal background optical radiation generated by, for example, objects heated to high temperatures from sunlight, heated car engines, building heaters, and incandescent or fluorescent lamps. Further, the optical sensor 12 is configured so as to allow the gain and sensitivity thereof to be raised to a level to reliably sense very weak optical signals, i.e., incident ultraviolet radiation of an intensity in a range of from about 1 picowatt per square centimeter to about 1 nanowatt per square centimeter.

In addition to the optical sensor 12, the detection device 10 of the first embodiment further comprises an alarm unit 14 which is electrically connected to the optical sensor 12 for generating an alarm signal in response to the electrical signal generated by the optical sensor 12. The alarm unit 14 may include a buzzer or other noise making unit for purposes of generating an audible alarm, and/or an LED or other signaling device for generating a visible alarm. The alarm unit 14 may also include an electronically generated voice warning signal unit. In addition to the above-described components, the detection device 10 of the first embodiment may also include a power supply 16 (shown in phantom in FIG. 1) which is electrically connected to the optical sensor 12 and the alarm unit 14. The power supply 16 will typically comprise one or more conventional batteries which require periodic replacement within the detection device 10. Those of ordinary skill in the art will recognize that if the on-board power supply 16 is not included in the detection device 10, an alternative source of power, such as a conventional plug-in connection, will be needed to supply power to the optical sensor 12 and to the alarm unit 14.

In the detection device 10 of the first embodiment, the optical sensor 12, alarm unit 14, and power supply 16 (if included) are disposed within a housing 18. The housing 18 is provided with an opening 20 which allows for the exposure of the optical sensor 12 to ultraviolet radiation. Though not shown, any buzzer or other noise making unit of the alarm unit 14 would preferably be included on an external surface of the housing 18. Similarly, an LED or other visual indication device of the alarm unit 14 would preferably be provided on an easily viewable external surface of the housing 18.

The optical sensor 12 of the detection device 10 is normally operable to sense ultraviolet radiation at a wide spacial detection angle of up to about 360 degrees. The spacial detection angle of the optical sensor 12 is its view angle or the range at which it is able to sense ultraviolet radiation. However, when the optical sensor 12 is disposed within the housing 18 adjacent the opening 20 in the manner shown in FIG. 1, the spacial detection angle thereof is limited to about 180 degrees. Such spacial detection angle could be increased to about 360 degrees by configuring the detection device 10 such that the optical sensor 12 protrudes from within the housing 18 via the opening 20.

Figure 2:
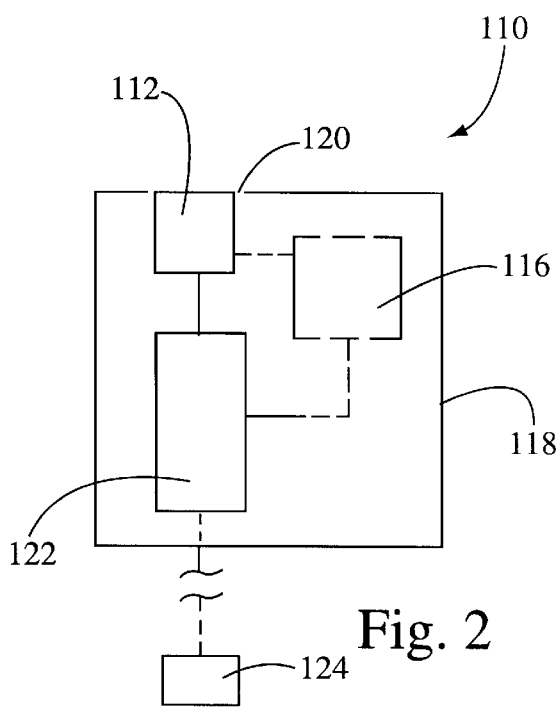
FIG. 2 is a block diagram of a corona discharge detection device constructed in accordance with a second embodiment of the present invention.

Referring now to FIG. 2, there is depicted a corona discharge detection device 110 constructed in accordance with a second embodiment of the present invention. The detection device 110 includes an optical sensor 112 which is identical to the previously described optical sensor 12. However, in the detection device 110, the optical sensor 112 is electrically connected to a transmission unit 122 rather than to the alarm unit 14 as described in relation to the detection device 10. The transmission unit 122 of the detection device 110 is adapted to establish radio frequency communication between the detection device 110 and a remote receiver unit 124. Rather than establishing radio frequency communication, the transmission unit 122 may establish infrared communication between the detection device 110 and the remote receiver unit 124.

The receiver unit 124 is adapted to receive the electrical signal generated by the optical sensor 112 of the detection device 110, and to generate either a visual and/or audible alarm in response to the presence of optical radiation within the prescribed range. Rather than being in radio frequency or infrared communication with the receiver unit 124, the optical sensor 112 of the detection device 110 may be hard wired directly to the receiver unit 124 to facilitate the direct transmission of the electrical signal indicative of the presence of a corona discharge or arc thereto. As will be recognized, the direct electrical connection of the optical sensor 112 to the receiver unit 124 would eliminate the need for the transmission unit 122 which, as indicated above, is used to facilitate radio frequency or infrared communication between the detection device 110 and the receiver unit 124.

As in the detection device 10 of the first embodiment, the detection device 110 of the second embodiment may also include an on-board power supply 116 (shown in phantom in FIG. 2) which is electrically connected to the optical sensor 112 and transmission unit 122 (if included). The optical sensor 112, transmission unit 122 (if included) and power supply 116 (if included) of the detection device 110 are preferably disposed within a housing 118 thereof which is identical to the previously described housing 18. In this respect, the optical sensor 112 is located adjacent an opening 120 within the housing 118.

Figure 3:
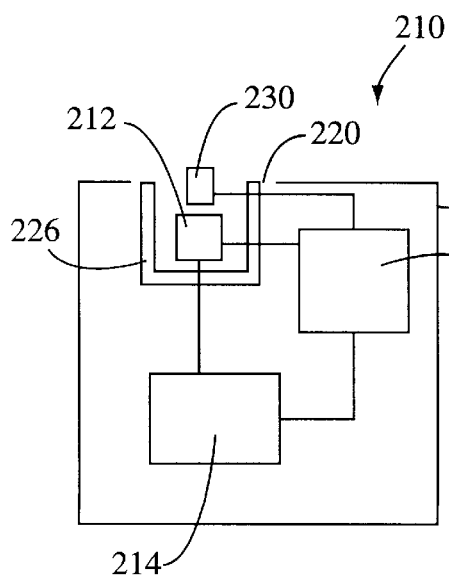
FIG. 3 is a block diagram of a corona discharge detection device constructed in accordance with a third embodiment of the present invention.
Figure 5:
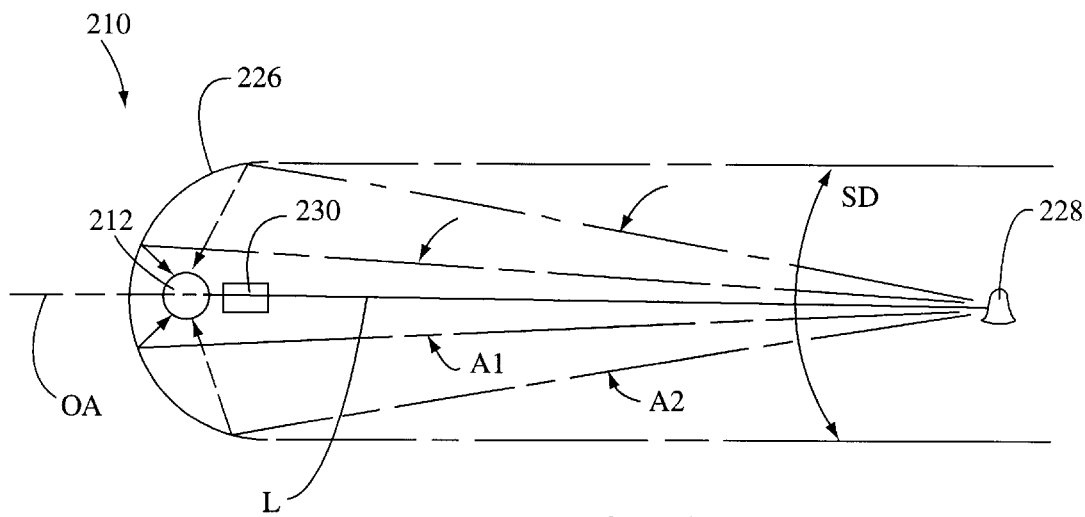
FIG. 5 is a schematic depiction illustrating the manner in which the inclusion of an optical concentrator in the detection device of the third embodiment governs the performance characteristics thereof.

Referring now of FIGS. 3 and 5, there is depicted a detection device 210 constructed in accordance with a third embodiment of the present invention. The detection device 210 of the third embodiment is similar to the detection device 10 of the first embodiment, and comprises an optical sensor 212 which is identical to the previously described optical sensor 12, and is electrically connected to an alarm unit 214 identical to the previously described alarm unit 14. The detection device 210 also includes a power supply 216 which is identical to the previously described power supply 16 and is electrically connected to both the optical sensor 212 and the alarm unit 214.

In the detection device 210 of the third embodiment, the optical sensor 212 is provided with an optical concentrator 226 which preferably comprises a parabolic reflective light concentrator. The optical concentrator 226 of the optical sensor 212 defines an optical axis OA. As seen in FIG. 5, without the optical concentrator 226, the optical sensor 212 would be able to collect the ultraviolet radiation from a source 228 such as a corona discharge or arc from a defective high voltage cable, transformer, or other piece of high voltage equipment at only a relatively narrow sensing angle A1. The inclusion of the optical concentrator 226 with the optical sensor 212 allows it to collect ultraviolet radiation from a substantially larger sensing angle A2, thus resulting in a higher signal and an increase in the detection distance of the optical sensor 212. However, the optical concentrator 226 limits or narrows the spacial detection angle of the optical sensor 212 to the spacial detection angle labeled SD in FIG. 5, similar to the manner in which a pair of binoculars or a telescope limit a spacial detection angle. In the detection device 210 of the third embodiment, the optical concentrator 226 of the optical sensor 212 may be configured to narrow the spacial detection angle to a range of from about 0.001 radians to about 1.0 radians, i.e., 60 degrees or less.

The detection device 210 of the third embodiment further preferably comprises a directional unit 230 which is electrically connected to the power supply 216 and disposed in front of the optical sensor 212 upon the optical axis OA defined thereby. The directional unit 230 is preferably a laser device which is operative to transmit a laser beam L along the optical axis OA. In the detection device 210 of the third embodiment, the strength of the electrical detection signal generated by the optical sensor 212 is strongest when the optical axis OA is aligned with the source 228. Advantageously, since the laser beam L travels along the optical axis OA, the same effectively illuminates (i.e., applies a visible laser beam spot to) the source 228, thus allowing the user of the detection device 210 to determine the precise location of the corona discharge producing defect. As indicated above, the corona discharge or arc providing the source 228 is often not visible to the naked eye. Thus, the inclusion of the directional unit 230 within the detection device 210 assists in pinpointing the defect. Though, due to its orientation, the directional unit 230 casts a small shadow upon the optical sensor 212, such shadow does not have a significant impact on the performance of the detection device 210.

When the optical sensor 212 is not provided with the optical concentrator 226, it possesses the capability to detect the ultraviolet radiation produced by the source 228 to a distance of up to about 60 feet. This distance may be increased to up to about 300 feet or more by providing the optical sensor 212 with the optical concentrator 226. In the detection device 210, the optical sensor 212 (including the optical concentrator 226), alarm and directional units 214, 230, and power supply 216 are preferably disposed within a housing 218 which is sized to be hand-held and has a gun-like configuration. The housing 218 is provided with an opening 220 for exposing the optical sensor 212 to ultraviolet radiation. The directional unit 230 is preferably disposed within the opening 220. Advantageously, configuring the housing 218 in the above-described manner allows the optical axis OA and spacial detection angle of the optical sensor 212 to be selectively maneuvered to point in any desired direction.

Figure 4:
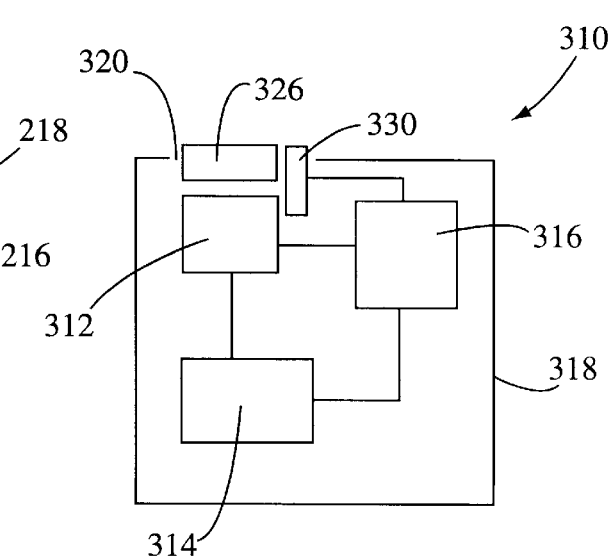
FIG. 4 is a block diagram of a corona discharge detection device constructed in accordance with a fourth embodiment of the present invention.
Figure 6:
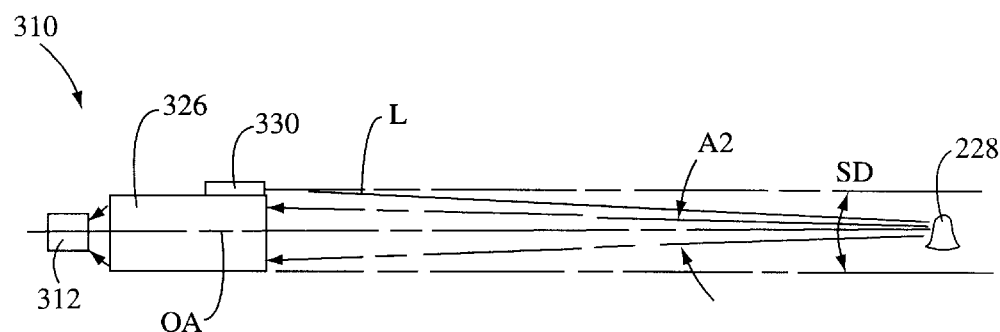
FIG. 6 is a schematic depiction illustrating the manner in which the inclusion of an optical concentrator in the detection device of the fourth embodiment governs the performance characteristics thereof.

Referring now to FIGS. 4 and 6, there is depicted a detection device 310 constructed in accordance with a fourth embodiment of the present invention. The detection device 310 of the fourth embodiment is similar in structure and operation to the detection device 210 of the third embodiment. In this respect, the detection device 310 includes an optical sensor 312 which is identical to the previously described optical sensor 212, and an alarm unit 314 which is electrically connected to the optical sensor 312 and identical to the previously described alarm unit 214. Also included in the detection device 310 is a power supply 316 which is identical to the previously described power supply 216, and is electrically connected to the optical sensor 312 and alarm unit 314.

Like the detection device 210 of the third embodiment, the optical sensor 312 of the detection device 310 of the fourth embodiment is provided with an optical concentrator 326. However, in the fourth embodiment, the optical concentrator 326 comprises a refractive ultraviolet transparent lens(es). The lens(es) may be made of fused silica, quartz, or any Uv transparent material with good transparency at the 185 nanometer to 260 nanometer band. The optical concentrator 326 of the optical sensor 312 defines an optical axis OA. As seen in FIG. 6, the inclusion of the optical concentrator 326 with the optical sensor 312 imparts the same performance characteristics thereto as previously described in relation to the inclusion of the optical concentrator 226 with the optical sensor 212.

The detection device 310 of the fourth embodiment also includes a directional unit 330 which is identical to the previously described directional unit 230 and is electrically connected to the power supply 316. However, rather than being disposed upon the optical axis OA, the directional unit 330 is disposed in side-by-side relation to the optical concentrator 326 of the optical sensor 312. As a result, as further seen in FIG. 6, the laser beam L transmitted by the directional unit 330 travels in generally parallel relation to, and gradually toward, the optical axis OA. The laser beam L visually pinpoints the source 228 of the ultraviolet radiation in the same manner as previously described in relation to the directional unit 230.

In the detection device 310, the optical sensor 312 (including the optical concentrator 326), alarm and directional units 314, 330, and power supply 316 are preferably disposed within a housing 318 which is identical in construction to the previously described housing 218. An opening 320 within the housing 318 facilitates the exposure of the optical sensor 312 to ultraviolet radiation, with the optical concentrator 326 thereof preferably residing within the opening 320 along with the directional unit 330.

It is contemplated that a defect in a high voltage cable, transformer, or other piece of high voltage equipment may be detected by initially employing the use of either the detection device 10 or the detection device 110. The detection device 10, 110 may be outfitted upon a helicopter or truck for purposes of localizing the area where the defect (i.e., the corona discharge or arc) exists. The precise location of the corona discharge or arc could then be pinpointed through the use of either the detection device 210 or the detection device 310. The pinpointed area of the defective high voltage equipment can be documented with a recording video camera with a zoom lens, mechanically connected with the corona discharge detecting device and optically aligned with the optical axis OA.

Additional modifications and improvements of the present invention may also be apparent to those of ordinary skill in the art. For example, the detection devices 210, 310 may each be provided with a transmission unit or hard wired to a remote receiver unit rather than being provided with the alarm unit 214, 314. Thus, the particular combination of parts and steps described and illustrated herein is intended to represent only certain embodiments of the present invention, and is not intended to serve as limitations of alternative devices within the spirit and scope of the invention.

What is claimed is:

1. A corona discharge detection device, comprising:
   an optical sensor for generating an electrical signal in response to the detection of ultraviolet radiation in a prescribed range;
   an alarm unit in communication with the optical sensor for generating an alarm signal in response to the electrical signal generated by the optical sensor; and
   a directional unit for determining the location of origin of the ultraviolet radiation.

2. The detection device of claim 1 wherein the alarm signal is audible.

3. The detection device of claim 1 wherein the alarm signal is visible.

4. The detection device of claim 1 further comprising a transmission unit for transmitting the electrical signal generated by the optical sensor to a remote receiver unit.

5. The detection device of claim 1 further comprising a power supply electrically connected to the optical sensor and to the alarm and directional units.

6. The detection device of claim 1 wherein the optical sensor is configured to sense ultraviolet radiation in a spectral range of from about 185 nanometers to about 260 nanometers.

7. The detection device of claim 6 wherein the optical sensor is configured to sense ultraviolet radiation of an intensity in a range of about 1 picowatt per square centimeter to about 1 nanowatt per square centimeter.

8. The detection device of claim 7 wherein the optical sensor is configured to sense ultraviolet radiation at a spacial detection angle of up to about 360 degrees.

9. The detection device of claim 8 wherein the optical sensor further comprises an optical concentrator for narrowing the spacial detection angle to a range of from about 0.001 radians to about 1.0 radians.

10. The detection device of claim 9 wherein the optical concentrator comprises at least one parabolic reflective light concentrator.

11. The detection device of claim 9 wherein the optical concentrator comprises at least one refractive ultraviolet transparent lens.

12. The detection device of claim 9 wherein:
   the optical concentrator defines an optical axis along which the sensitivity of the optical sensor to ultraviolet radiation is at a maximum; and
   the directional unit comprises a laser device which is configured to transmit a laser beam in substantially parallel relation to the optical axis.

13. The detection device of claim 12 wherein the laser device is configured to transmit the laser beam along the optical axis.

14. The detection device of claim 6 wherein the optical sensor is selected from the group consisting of:
- vacuum solar blind photomultiplier tubes;
- semiconductor sensors with ultraviolet filters;
- solar blind avalanche vacuum photodiodes;
- gas filled photodiodes; and
- semiconductor photodiodes.

15. The detection device of claim 1 wherein the optical sensor, the alarm and directional units, and the power supply are contained within a hand-held housing.

16. A method for detecting a corona discharge in a defined area, comprising the steps of:
- (a) providing a detection device having an optical sensor for generating an electrical signal in response to the detection of ultraviolet radiation in a prescribed range;
- (b) positioning the detection device such that the optical sensor is capable of sensing the prescribed range of ultraviolet radiation within the defined area;
- (c) generating an alarm signal in response to the electrical signal generated by the optical sensor; and
- (d) determining the location of origin of the ultraviolet radiation.

17. The method of claim 16 step (c) comprises:
- (1) transmitting the electrical signal generated by the optical sensor to a remote receiver unit; and
- (2) generating the alarm signal from the remote receiver unit.

18. The method of claim 16 wherein step (d) comprises transmitting a laser beam along an optical axis of the optical sensor.

19. The method of claim 16 wherein:
- step (a) comprises configuring the optical sensor of the detection device to sense the prescribed range of ultraviolet radiation at a spacial detection angle in a range of from about 0.001 radians to about 1.0 radians; and
- step (b) comprises positioning the detection device such that the spacial detection angle thereof encompasses the defined area.

20. The method of claim 19 wherein step (a) comprises configuring the optical sensor to sense ultraviolet radiation in a spectral range of from about 185 nanometers to about 260 nanometers, and at an intensity in a range of about 1 picowatt per square centimeter to about 1 nanowatt per square centimeter.

21. A corona discharge detection device, comprising:
- an optical sensor for generating an electrical signal in response to the detection of ultraviolet radiation in a spectral range of from about 185 nanometers to about 260 nanometers; and
- an alarm unit in communication with the optical sensor for generating an alarm signal in response to the electrical signal generated by the optical sensor.

22. A method for detecting a corona discharge in a defined area, comprising the steps of:
- (a) providing a detection device having an optical sensor for generating an electrical signal in response to the detection of ultraviolet radiation in a spectral range of from about 185 nanometers to about 260 nanometers, and at an intensity in a range of from about 1 picowatt per square centimeter to about 1 nanowatt per square centimeter;
- (b) positioning the detection device such that the optical sensor is capable of sensing the prescribed range of ultraviolet radiation within the defined area; and
- (c) generating an alarm signal in response to the electrical signal generated by the optical sensor.

* * * * *